United States Patent
Jang et al.

(10) Patent No.: US 11,978,817 B2
(45) Date of Patent: May 7, 2024

(54) SOLAR POWER GENERATION MODULE AND METHOD OF MANUFACTURING THE SAME

(71) Applicant: MECAROENERGY CO., LTD., Eumseong-gun (KR)

(72) Inventors: Hyuk Kyoo Jang, Cheongju-si (KR); Gyu Hyun Lee, Chungju-si (KR)

(73) Assignee: MECAROENERGY CO., LTD., Eumseong-gun (KR)

( * ) Notice: Subject to any disclaimer, the term of this patent is extended or adjusted under 35 U.S.C. 154(b) by 0 days.

(21) Appl. No.: 17/853,801

(22) Filed: Jun. 29, 2022

(65) Prior Publication Data
US 2023/0053683 A1   Feb. 23, 2023

(30) Foreign Application Priority Data
Aug. 23, 2021   (KR) .......................... 10-2021-0111071

(51) Int. Cl.
*H01L 31/048* (2014.01)
*H01L 31/0445* (2014.01)

(52) U.S. Cl.
CPC ...... *H01L 31/0481* (2013.01); *H01L 31/0445* (2014.12)

(58) Field of Classification Search
CPC .............. H01L 31/048; H01L 31/0481; H01L 31/0488; H01L 31/049; H01L 31/0445; H01L 31/046; H01L 31/0463; H01L 31/047; H01L 31/0475; H01L 31/0203; H01L 31/49
See application file for complete search history.

(56) References Cited

U.S. PATENT DOCUMENTS

| | | | |
|---|---|---|---|
| 6,087,579 | A | 7/2000 | Muskateve |
| 2009/0173959 | A1 | 7/2009 | Nakata |
| 2014/0332062 | A1 * | 11/2014 | Cho .................... H01L 31/0488 136/251 |

(Continued)

FOREIGN PATENT DOCUMENTS

| KR | 101091372 | 12/2011 |
|---|---|---|
| KR | 20210025235 | 3/2021 |

OTHER PUBLICATIONS

Unbound Solar, "Solar Panel Size Guide: How Big is A Solar Panel?", https://unboundsolar.com/blog/solar-panel-size-guide, Aug. 1, 2019, All Pages. (Year: 2019).*

(Continued)

*Primary Examiner* — Daniel P Malley, Jr.
(74) *Attorney, Agent, or Firm* — YOU & IP, LLC; Wansik You

(57) ABSTRACT

Provided is a solar power generation module, comprising: a lower substrate 100 into which solar cells 200 are inserted; and an upper substrate 300 disposed on the lower substrate 100, wherein the lower substrate 100 comprises piercing parts 110 configured to pass through the lower substrate 100, or spatial groove parts 115 formed in their respective groove shapes in the lower substrate 100, each of the solar cells 200 is disposed in a space between each of the piercing parts 110 or the spatial grove parts 115 of the lower substrate 100, and the upper substrate 300 is disposed at an upper portion of the lower substrate 100 into which the solar cells 200 are inserted.

12 Claims, 11 Drawing Sheets

(56) References Cited

U.S. PATENT DOCUMENTS

| | | | |
|---|---|---|---|
| 2015/0136207 A1* | 5/2015 | Giron | B32B 17/10889 |
| | | | 438/66 |
| 2019/0140121 A1* | 5/2019 | Ueda | H01L 31/048 |
| 2022/0190178 A1* | 6/2022 | Kang | H01L 31/02 |

OTHER PUBLICATIONS

European Search Report—European Application No. 22182155.6 dated Nov. 24, 2022, citing US 2009/0173959, U.S. Pat. No. 6,087,579, and KR 2021-0025235.

* cited by examiner (a) (b)

(a)         (b)

(a)

(b)

(a)   (b)

(a)                    (b)

SOLAR POWER GENERATION MODULE AND METHOD OF MANUFACTURING THE SAME

BACKGROUND OF THE INVENTION

Field of the Invention

The present invention relates to a solar power generation module and a method of manufacturing the same, and more particularly, to a solar power generation module and a method of manufacturing the same that are capable of reducing weight more than ever and minimalizing discoloration resulting from outdoor use for long time.

Description of the Related Arts

A solar cell is a device that converts the energy of light into electrical energy using semiconductor properties.

A solar power generation module which converts the energy of light into electrical energy using a photoelectric conversion effect has widely been used as a means for obtaining pollution-free energy which contributes to the preservation of global environments.

In order to output electric power, which is generated from a solar power generation module having solar cells generating electric power from sunlight, to the outside, conductors which perform the functions of positive and negative electrodes are disposed in the solar power generation module, and electric currents are outputted to the outside through cables connected to connecting terminals.

However, sunlight could not penetrate the solar cells or it was difficult to grow plants under a structure in which the solar cells were installed due to low transmittance, and in order to solve this disadvantage, the development of technologies for solar cells having high transmittance has been performed.

Korean Patent No. 10-1091372 (Dec. 1, 2011) discloses that solar cells are installed perpendicularly to two transparent substrates or are installed to maintain an inclination to a certain degree, and thus are designed to make sunlight penetrate a space between each solar cell installed so that the excellent transmittance of light can be realized, and electric power can also be obtained from the solar cells installed.

However, this method is disadvantageous in that since each of the solar cells installed in two transparent substrates is impregnated with a sealing member, such as photo-curable resin or thermosetting resin, and so on, the weight increases due to curable resin.

Furthermore, because sunlight penetrates through the curable resin, discoloration of the curable resin occurs with the lapse of use time in the outdoors, and accordingly, it is problematic in that the transmittance of light decreases remarkably, and in that a penetrating phase is partially distorted because it is difficult to maintain the refractive index uniformly when the curable resin used in the sealing member is coated.

SUMMARY OF THE INVENTION

The present invention has been devised for solving the aforesaid problems, and in the present invention, thanks to improvement of the structure of the conventional art in which each of solar cells located in transparent substrates is impregnated with a sealing member of photo-curable resin or thermosetting resin, and so on, a solar power generation module can reduce weight sharply because void spaces (piercing parts or spatial groove parts) are formed in a transparent substrate.

Furthermore, the solar power generation module according to the present invention can minimalize discoloration resulting from outdoor use for long time because curable resin is used in the minimum quantity, and can cause the penetration of sunlight to be realized naturally, thereby solving the problem which shows that a phase is distorted visually.

In order to solve the aforesaid problems, according to one exemplary embodiment of the present invention, a solar power generation module may comprise: a lower substrate 100 into which solar cells 200 are inserted; and an upper substrate 300 disposed on the lower substrate 100, wherein the lower substrate 100 comprises piercing parts 110 configured to pass through the lower substrate 100, or spatial groove parts 115 formed in their respective groove shapes in the lower substrate 100, each of the solar cells 200 is disposed in a space between each of the piercing parts 110 or the spatial groove parts 115 of the lower substrate 100, and the upper substrate 300 is disposed at an upper portion of the lower substrate 100 into which the solar cells are inserted.

According to another exemplary embodiment of the present invention, the piercing parts 110 or the spatial groove parts 115 may be formed in their respective line types in the lower substrate 100, each of the solar cells may be formed in a line type in the space between each of the piercing parts or the spatial groove parts 115 of the lower substrate 100.

According to the other exemplary embodiment of the present invention, the lower substrate 100 and the upper substrate 300 may be composed of a transparent material of a glass, acrylic, polycarbonate (PC), polyethylene (PE), or polymethyl methacrylate (PMMA) material.

According to the other exemplary embodiment of the present invention, each of the solar cells 200 may be inserted and disposed into the space between each of the piercing parts 110 or the spatial groove parts 115 of the lower substrate 100 perpendicularly to or at a fixed angle to the lower substrate 100.

According to the other exemplary embodiment of the present invention, each of the solar cells may be 5 mm to 100 mm in width.

According to the other exemplary embodiment of the present invention, the solar cells 200 may consist of crystalline silicon solar cells, copper indium gallium selenide (CIGS) thin-film solar cells, cadmium telluride (CdTe) thin-film solar cells, or amorphous silicon solar cells.

According to the other exemplary embodiment of the present invention, the lower substrate 100, the solar cells 200, and the upper substrate 300 may be combined with one another using an adhesive, photo-curable resin, or thermosetting resin.

According to the other exemplary embodiment of the present invention, the upper substrate 300 may comprise groove parts 310 having their respective shapes corresponding to the piercing parts 110 or the spatial groove parts 115.

A method of manufacturing a solar power generation module according to the other exemplary embodiment of the present invention may comprise: a first step of forming a lower substrate 100 comprising piercing parts 110 configured to pass through the lower substrate 100, or spatial groove parts 115 formed in their respective groove shapes in the lower substrate 100, and insertion groove parts 201 into which solar cells 200 are inserted, respectively; a second step of cutting the solar cells 200; a third step of inserting each of the solar cells 200 into a space between each of the piercing parts 110 or the spatial groove parts 115 of the lower substrate 100; a fourth step of fixing the solar cells 200 to the insertion groove parts 201 of the lower substrate 100, respectively using an adhesive, photo-curable resin, or thermosetting resin; a fifth step of connecting electrodes of the solar cells 200 to one another; and a sixth step of disposing an upper substrate 300 at an upper portion of the lower substrate 100 into which the solar cells 200 are inserted, and combining the lower substrate, the solar cells, and the upper substrate with one another.

According to the other exemplary embodiment of the present invention, the first step may show forming the lower substrate 100 comprising the piercing parts 110 or the spatial groove parts 115 formed in their respective line types, and the second step may show cutting the solar cells 200 in their respective line types.

According to the other exemplary embodiment of the present invention, the first step may further comprise forming the lower substrate 100 with a transparent material of a glass, acrylic, polycarbonate (PC), polyethylene (PE), or polymethyl methacrylate (PMMA) material, and the sixth step may further comprise forming the upper substrate 300 composed of a transparent material of a glass, acrylic, polycarbonate (PC), polyethylene (PE), or polymethyl methacrylate (PMMA) material.

According to the other exemplary embodiment of the present invention, the third step may show that into the space between each of the piercing parts 110 or the spatial groove parts of the lower substrate 100, each of the solar cells is inserted perpendicularly to or at a fixed angle to the lower substrate 100.

According to the present invention, thanks to improvement of the structure of the conventional art in which each of solar cells located in transparent substrates is impregnated with a sealing member, such as photo-curable resin or thermosetting resin, and so on, the solar power generation module can reduce weight sharply because void spaces (piercing parts or spatial groove parts) are formed in a transparent substrate.

Furthermore, the solar power generation module according to the present invention can minimize discoloration resulting from outdoor use for long time because curable resin is used in the minimum quantity, and can cause the penetration of sunlight to be realized naturally, thereby solving the problem which shows that a phase is distorted visually.

DETAILED DESCRIPTION OF THE INVENTION

Figure 1:
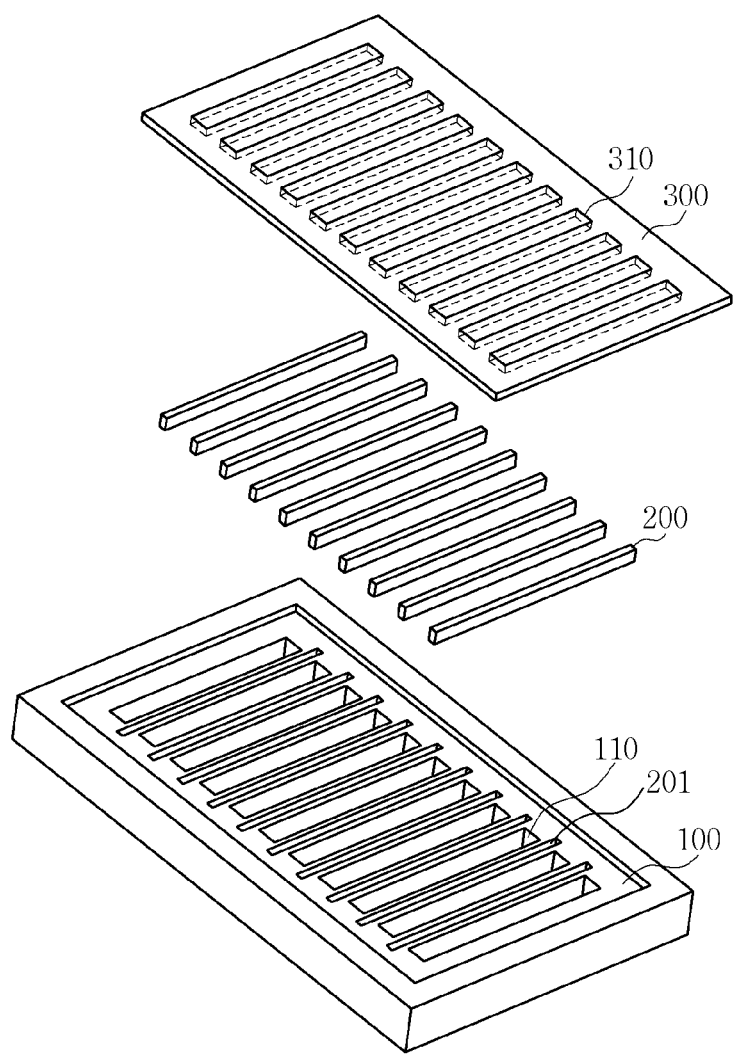
FIG. 1 is a disjointed perspective view showing a solar power generation module according to one exemplary embodiment of the present invention.

Hereinafter, exemplary embodiments of the present invention will be described in detail with reference to the accompanying drawings. In the following description with regard to embodied forms, it is to be noted that, when the detailed description of conventional functions or constitutions related with the present invention may make the gist of the present invention unnecessarily unclear, the detailed description thereof will be omitted. Also, it should be understood that the sizes of the constituent elements shown in the drawings may be exaggeratedly drawn, and do not mean actually applied sizes.

FIG. 1 is a disjointed perspective view showing a solar power generation module according to one exemplary embodiment of the present invention, and FIG. 2 to FIG. 6 are a front view and a side view showing the solar power generation module according to one exemplary embodiment of the present invention.

Figure 2:
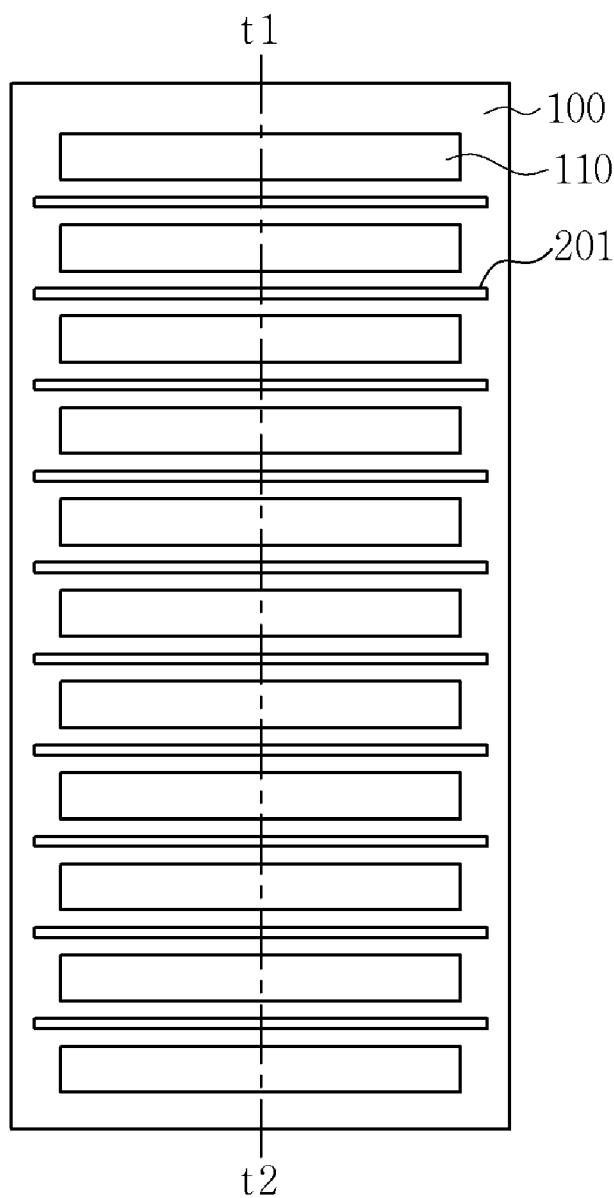
FIG. 2 to FIG. 6 are a front view and a side view showing the solar power generation module according to one exemplary embodiment of the present invention.
Figure 2:
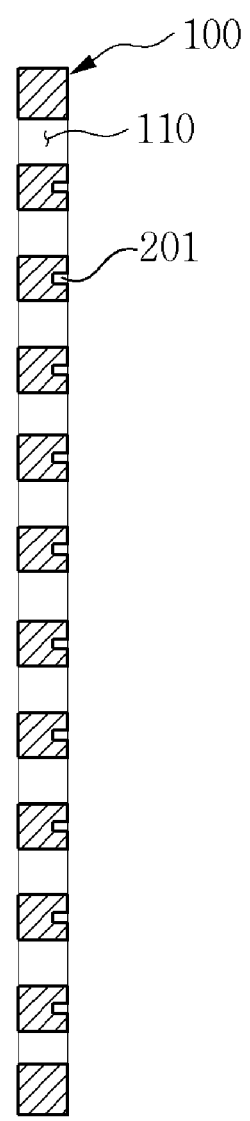

At this time, (A) shown in FIG. 2 is a plane view showing a lower substrate of the solar power generation module according to one exemplary embodiment of the present invention, and (B) shown in FIG. 2 is a cross-sectional view along line t1-t2 showing the lower substrate of the solar power generation module according to one exemplary embodiment of the present invention illustrated in (A) shown in FIG. 2.

Figure 3:
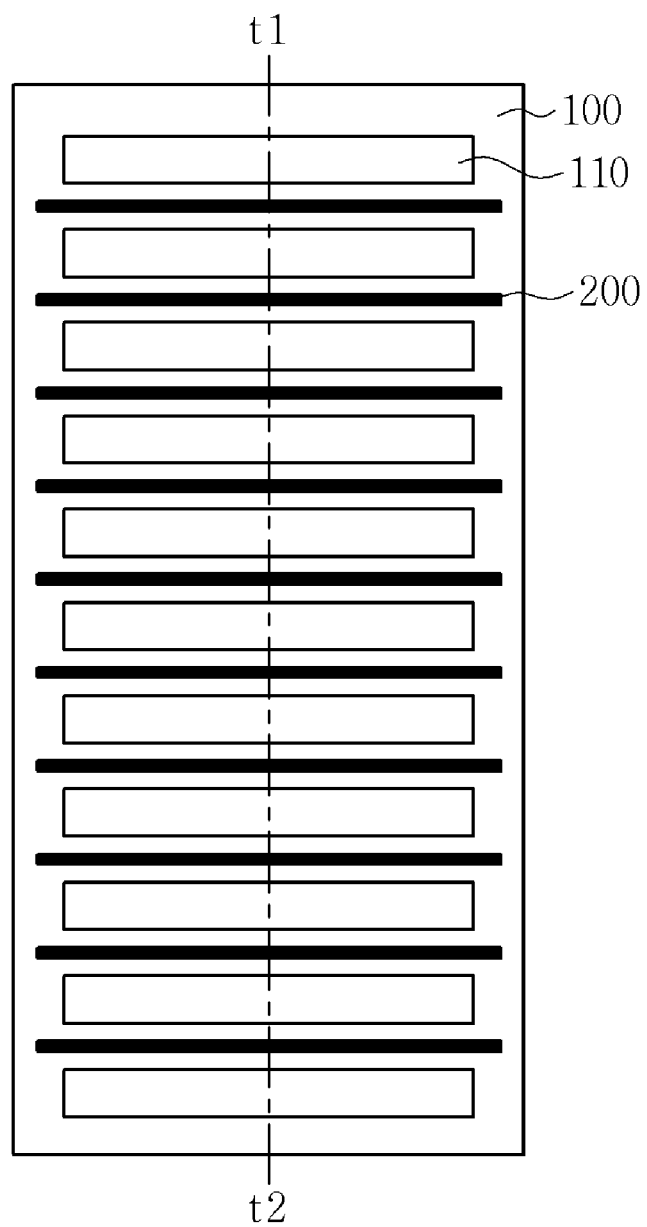
Figure 3:
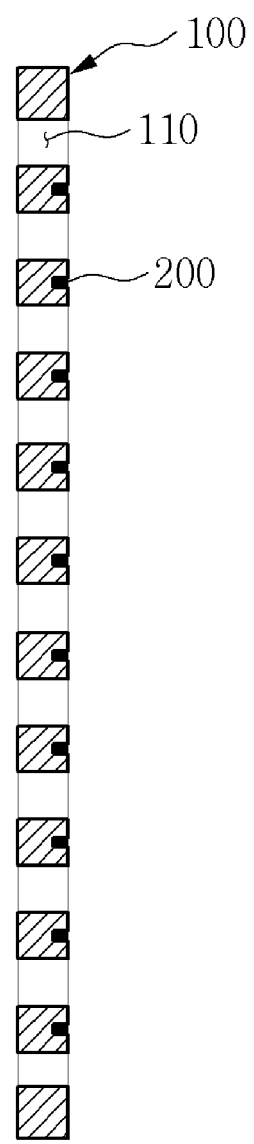

Furthermore, (A) shown in FIG. 3 is another plane view showing the lower substrate of the solar power generation module according to one exemplary embodiment of the present invention, and (B) shown in FIG. 3 is another cross-sectional view along line t1-t2 showing the lower substrate of the solar power generation module according to one exemplary embodiment of the present invention illustrated in (A) shown in FIG. 3.

Hereinafter, the constitutions of the solar power generation module according to one exemplary embodiment of the present invention are described with reference to FIG. 1 to FIG. 6.

The solar power generation module according to one exemplary embodiment of the present invention comprises: a lower substrate 100; solar cells 200; and an upper substrate 300.

The solar cells 200 are inserted into the lower substrate 100, and the upper substrate 300 is disposed on the lower substrate into which the solar cells 200 are inserted.

More specifically, piercing parts 110 are formed in the lower substrate 100, and at this time, the piercing parts 110 may be formed to pass through the lower substrate 100.

At this time, each of the piercing parts 110 may be formed in a line type in the lower substrate 100, and each of the solar cells 200 may be formed in a line type and may be inserted into a space between each of the piercing parts 110 of the lower substrate 100.

The lower substrate 100 may be composed of a transparent material of a glass, acrylic, polycarbonate (PC), polyethylene (PE), or polymethyl methacrylate (PMMA) material.

Each of the solar cells 200 may be disposed in the space between each of the piercing parts 110 of the lower substrate 100, and at this time, the solar cells 200 may be disposed perpendicularly to a surface of the lower substrate 100, or the solar cells 200 may be inserted to be inclined at a fixed angle to the surface of the lower substrate 100.

More specifically, the solar cells 200 may be disposed to stand erect at an angle of 90° to the surface of the lower substrate 100, or the solar cells 200 may be disposed to stand erect at an angle of 45° to 90° to the surface of the lower substrate 100.

Like this, according to the present invention, as an inclined angle of the solar cells 200 to the lower substrate 100 is adjusted, a ray of light incident upon the solar cells 200 is adjusted so that photoelectric conversion efficiency can be optimized.

Figure 4:
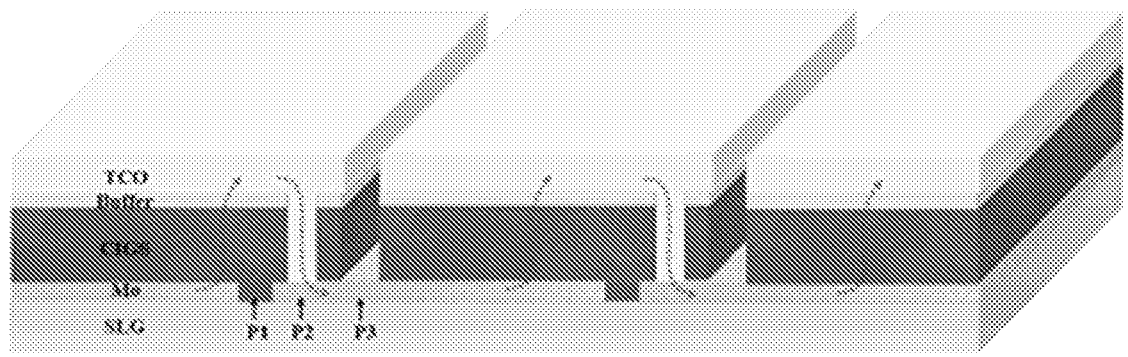
Figure 4:
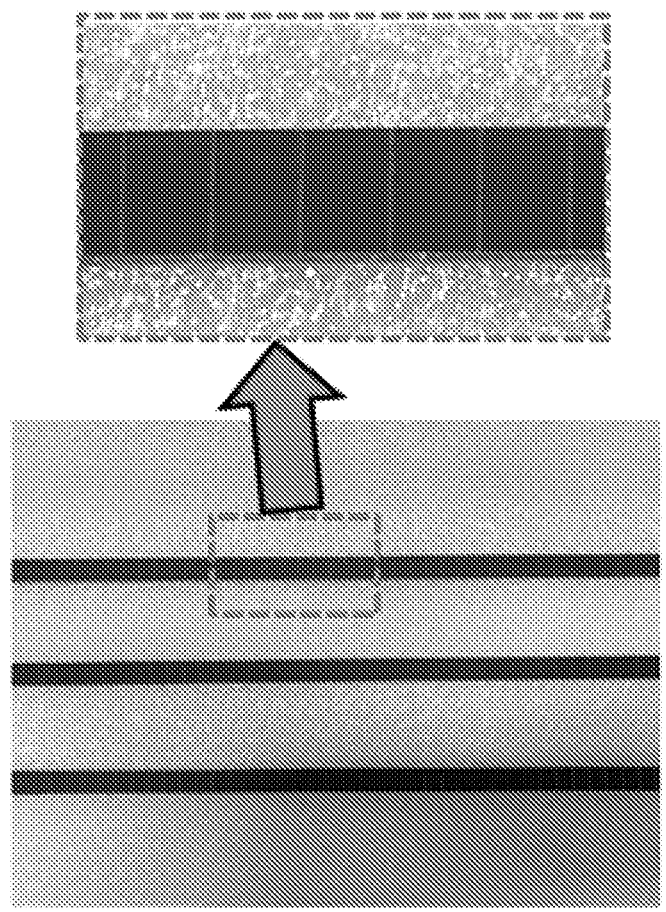
Figure 5:
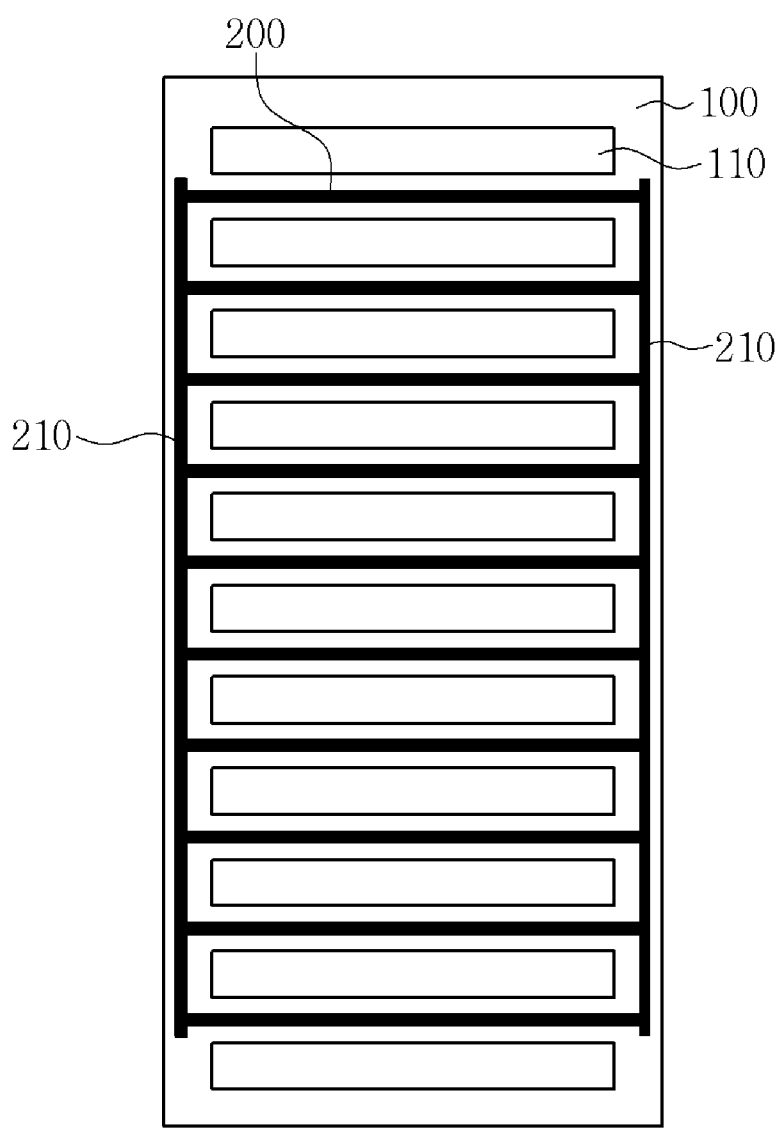
Figure 6:
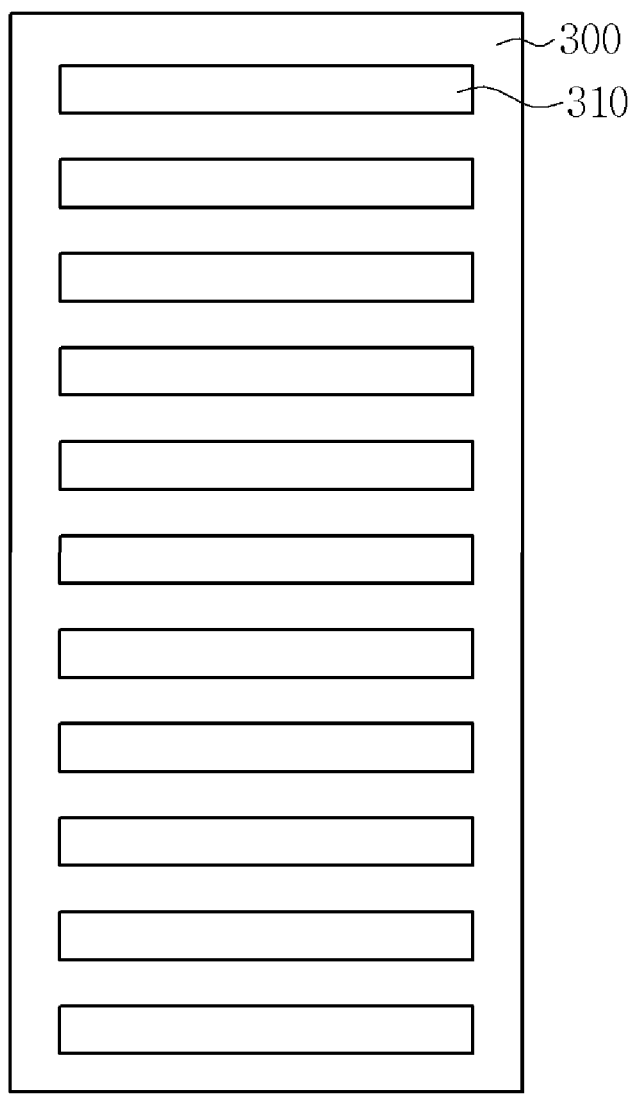

At this time, each of the solar cells 200 may be 5 mm to 100 mm in width, the solar cells 200 may consist of crystalline silicon solar cells, copper indium gallium selenide (CIGS) thin-film solar cells, cadmium telluride (CdTe) thin-film solar cells, or amorphous silicon solar cells, (A) shown in FIG. 4 illustrates the structure of monolithically connected CIGS thin-film solar cells, and (B) shown in FIG. 4 illustrates actual monolithic CIGS thin-film solar cells.

The lower substrate 100, the solar cells 200, and the upper substrate 300 configured as described above may firmly be combined with and fixed to one another using an adhesive, photo-curable resin or thermosetting resin, and the solar cells 200 may be connected to one another via electrodes 210.

Furthermore, the upper substrate 300 may be disposed at an upper portion of the lower substrate 100 into which the solar cells 200 are inserted, and the upper substrate 300 may comprise groove parts 310 having their respective shapes corresponding to the piercing parts 110.

Like this, when the groove parts 310 are formed in the upper substrate 300, the solar power generation module can reduce weight more than ever.

Furthermore, according to one exemplary embodiment of the present invention, each of the piercing parts 110 of the lower substrate 100 or each of the groove parts 310 of the upper substrate 300 may be filled with a functional filling member.

In case that the functional filling member is an adhesive, the lower substrate 100 and the upper substrate 300 may adhere to each other more firmly so that the solar cells 200 and the electrodes 210 can be prevented from being eaten away with external substances.

Furthermore, the functional filling member may be composed of transparent insulating substance, and thermosetting resin or photo-curable resin may be used. As the more detailed examples, transparent resins, such as ethylene vinyl acetate (EVA) and so on, may be used.

In addition to, in case that the solar power generation module according to one exemplary embodiment is used in a window frame, a material capable of adjusting a penetration amount or a reflection amount of sunlight may be used in the functional filling member.

Accordingly, when the solar power generation module according to one exemplary embodiment of the present invention is used in a window frame, solar power generation efficiency may be optimized by adjustment of an inclined angle of the solar cells 200 to the lower substrate 100 and by the functional filling member, and the optimum interior illuminance suitable for each indoor characteristic may also be provided.

Furthermore, in case that the solar power generation module according to one exemplary embodiment of the present invention is installed on an outer wall, a color of the functional filling member may be selected according to a color or an environment of the outer wall.

Figure 7:
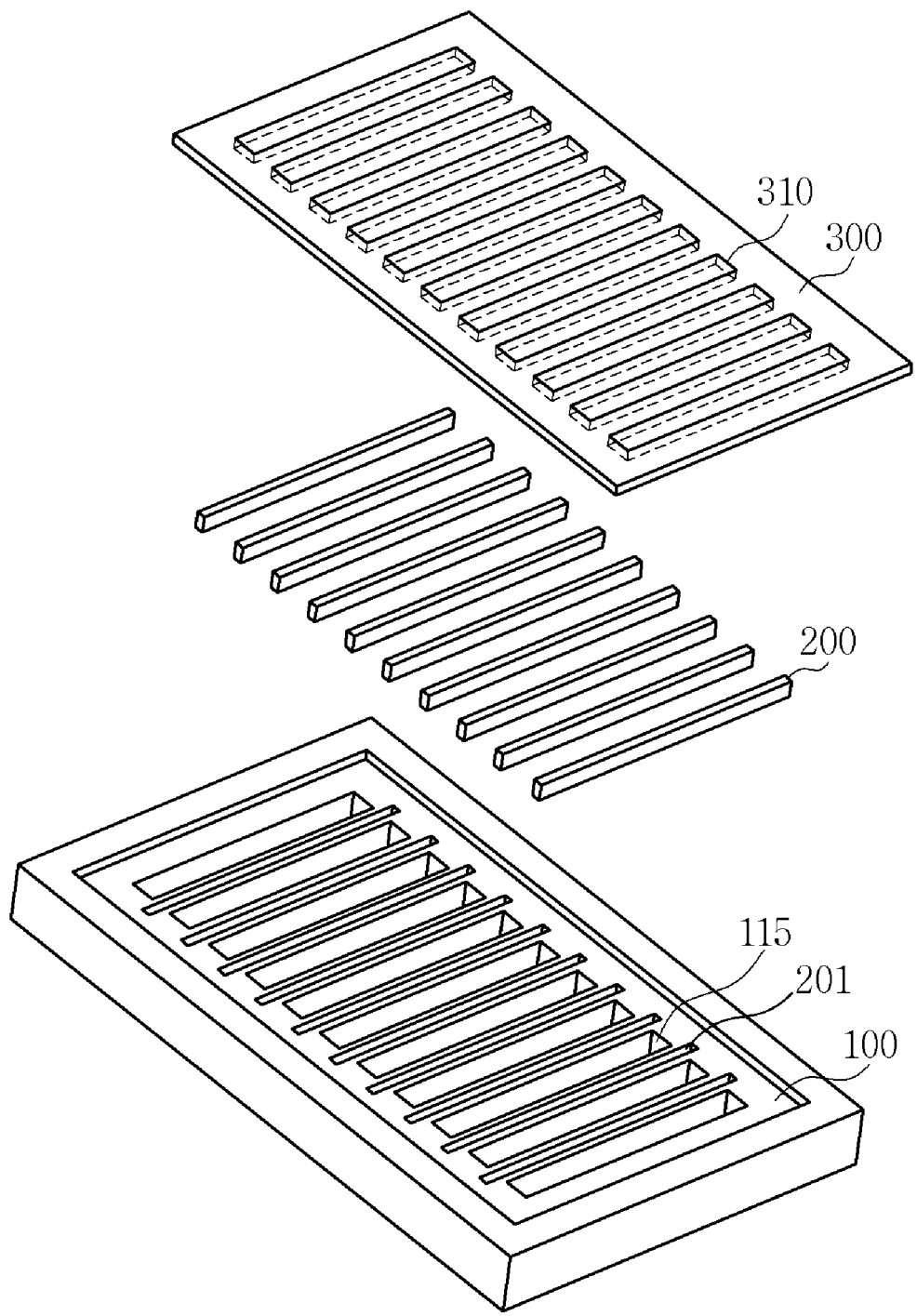
FIG. 7 is a disjointed perspective view showing a solar power generation module according to another exemplary embodiment of the present invention.
Figure 8:
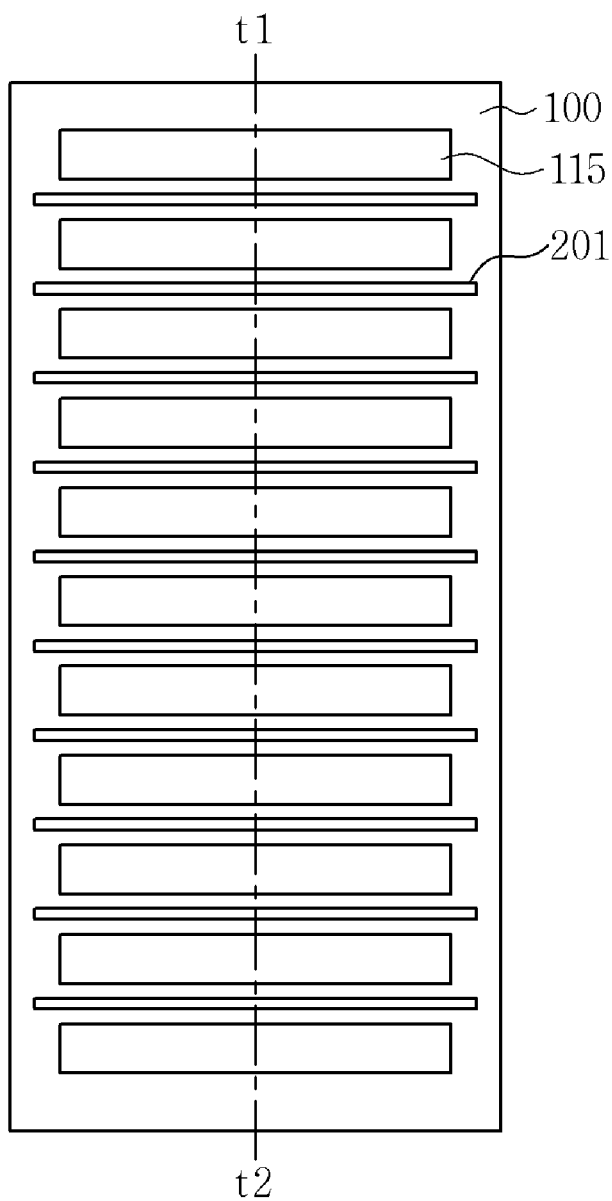
FIG. 8 to FIG. 10 are a front view and a side view showing the solar power generation module according to another exemplary embodiment of the present invention.
Figure 8:
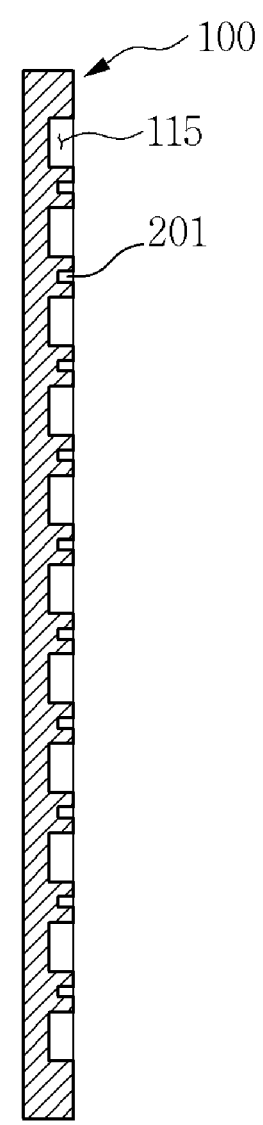
Figure 9:
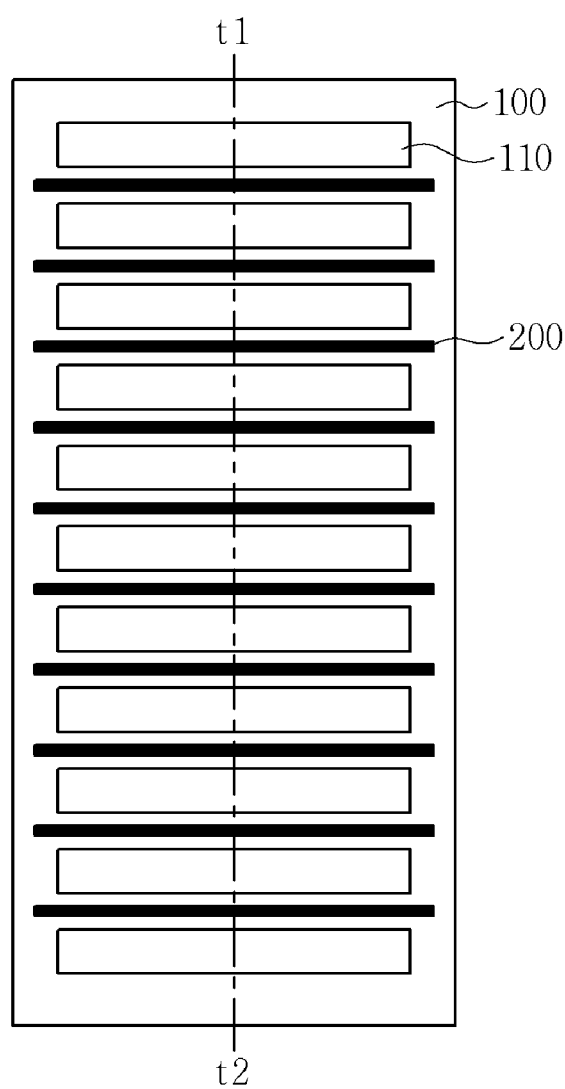
Figure 9:
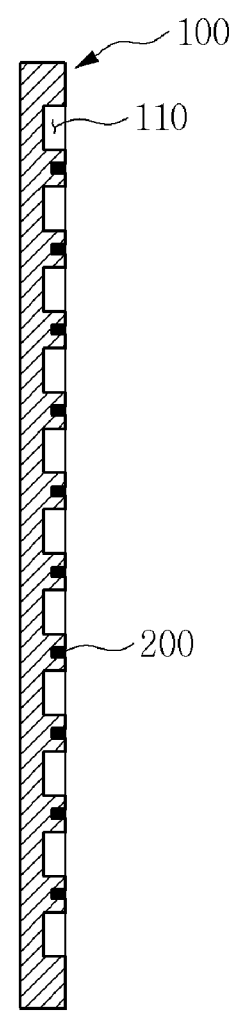
Figure 10:
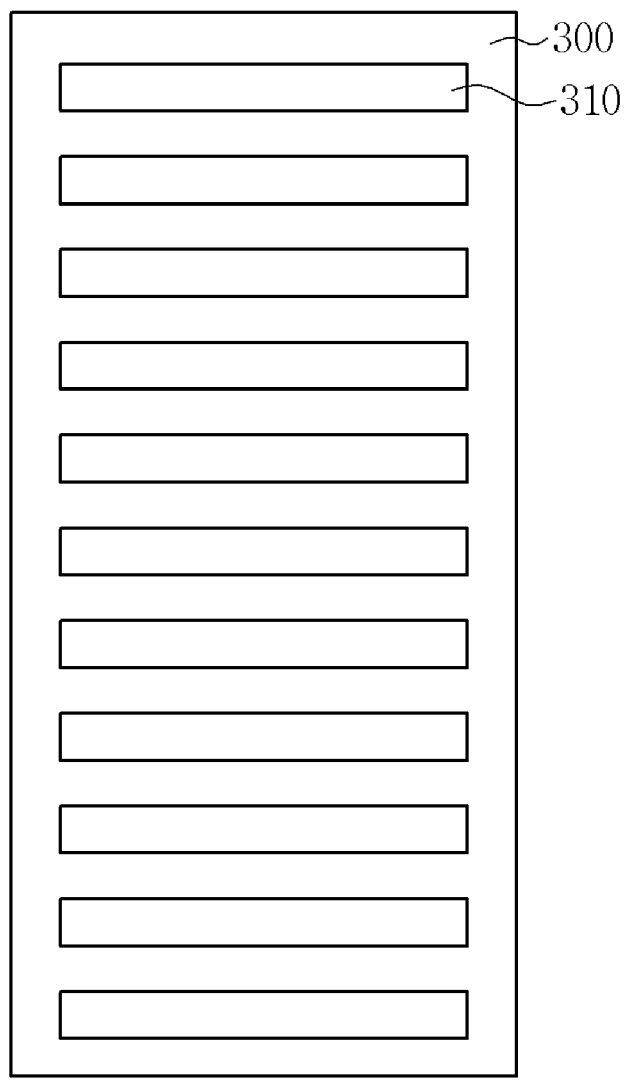

FIG. 7 is a disjointed perspective view showing a solar power generation module according to another exemplary embodiment of the present invention, and FIG. 8 to FIG. 10 are a front view and a side view showing the solar power generation module according to another exemplary embodiment of the present invention.

Hereinafter, the constitutions of the solar power generation module according to another exemplary embodiment of the present invention are described with reference to FIG. 7 to FIG. 10.

The solar power generation module according to another exemplary embodiment of the present invention also comprises: a lower substrate 100; solar cells 200; and an upper substrate 300, wherein the solar cells 200 are inserted into the lower substrate 100, and the upper substrate 300 is disposed on the lower substrate 100 into which the solar cells 200 are inserted.

However, in the solar power generation module according to another exemplary embodiment of the present invention, spatial groove parts 115 formed in their respective groove shapes may be formed in the lower substrate 100.

At this time, each of the spatial groove parts 115 may be formed in a line type in the lower substrate 100, and each of the solar cells 200 may be formed in a line type and may be inserted into a space between each of the spatial groove parts 115 of the lower substrate 100.

Moreover, the lower substrate 100 may be composed of a transparent material of a glass, polycarbonate (PC), polyethylene (PE), or polymethyl methacrylate (PMMA) material.

Also, each of the solar cells 200 may be disposed in a space between each of the piercing parts 110 of the lower substrate 100, and at this time, the solar cells 200 may be disposed perpendicularly to a surface of the lower substrate 100, or the solar cells 200 may be inserted and disposed to be inclined at a fixed angle to the surface of the lower substrate.

More specifically, the solar cells 200 may be disposed to stand erect at an angle of 90° to the surface of the lower substrate 100, or the solar cells 200 may be disposed to stand erect at an angle of 45° to 90° to the surface of the lower substrate 100.

Like this, according to the present invention, as an inclined angle of the solar cells 200 to the lower substrate 100 is adjusted, a ray of light incident upon the solar cells 200 is adjusted so that photoelectric conversion efficiency can be optimized.

At this time, the solar cells 200 may be 5 mm to 100 mm in their respective widths, and the solar cells 200 may consist of crystalline silicon solar cells, copper indium gallium selenide (CIGS) thin-film solar cells, cadmium telluride (CdTe) thin-film solar cells or amorphous silicon solar cells.

The lower substrate 100, the solar cells 200, and the upper substrate 300 configured as described above may firmly be combined with and fixed to one another using an adhesive, photo-curable resin or thermosetting resin, and the solar cells 200 may be connected to one another via electrodes 210.

Furthermore, the upper substrate 300 may be disposed at an upper portion of the lower substrate 100 into which the solar cells 200 are inserted, and the upper substrate 300 may comprise groove parts 310 having their respective shapes corresponding to the spatial groove parts 115.

Like this, when the groove parts 310 are formed in the upper substrate 300, the solar power generation module can reduce weight more than ever.

Furthermore, according to another exemplary embodiment of the present invention, each of the spatial groove parts 115 of the lower substrate 100 or each of the groove parts 310 of the upper substrate 300 may be filled with a functional filling member.

In case that the functional filling member is an adhesive, the lower substrate 100 and the upper substrate 300 may adhere to each other more firmly so that the solar cells 200 and the electrodes 210 can be prevented from being eaten away with external substances.

Furthermore, the functional filling member may be composed of transparent insulating substance, and thermosetting resin or photo-curable resin may be used. As the more detailed examples, transparent resins, such as ethylene vinyl acetate (EVA) and so on, may be used.

In addition to, in case that the solar power generation module according to another exemplary embodiment is used in a window frame, a material capable of adjusting a penetration amount or a reflection amount of sunlight may be used in the functional filling member.

Figure 11:
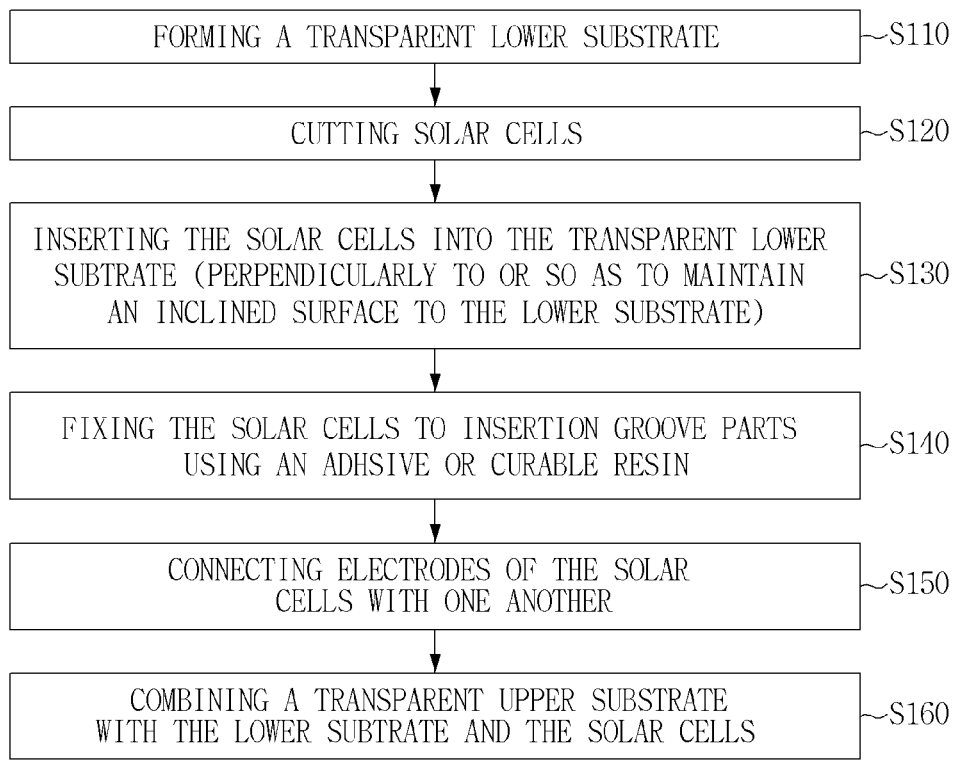
FIG. 11 is a flow chart for explaining a method of manufacturing a solar power generation module according to the other exemplary embodiment of the present invention.

FIG. 11 is a flow chart for explaining a method of manufacturing a solar power generation module according to the other exemplary embodiment.

Hereinafter, the method of manufacturing a solar power generation module according to the other exemplary embodiment is described with reference to FIG. 11.

First, a lower substrate 100 is formed S110. Describing in more detail, the lower substrate 100 comprises: piercing parts 110 configured to pass through the lower substrate 100, or spatial groove parts 115 formed in their respective groove shapes in the lower substrate 100; and insertion groove parts 201 into which solar cells 200 are inserted, respectively.

At this time, the lower substrate 100 may comprise the piercing parts 110 or the spatial groove parts 115 formed in their respective line types, and the lower substrate 100 may be composed of a transparent material of a glass, acrylic, polycarbonate (PC), polyethylene (PE) or polymethyl methacrylate (PMMA) material.

According to the other exemplary embodiment of the present invention, as described above, because the piercing parts 110 or the spatial groove parts 115 of the lower substrate 100 are formed, the solar power generation module can reduce weight sharply.

Moreover, when the lower substrate 100 is manufactured, it may be manufactured by a method, such as direct processing, or injection for mass production, and so on.

Then, the solar cells 200 are cut S120, and at this time, the solar cells 200 are cut in their respective line types, so each of the solar cells 200, which are cut, is inserted into a space between each of the piercing parts 110 or the spatial groove parts 115 of the lower substrate 100 S130.

More specifically, into the space between each of the piercing parts 110 or the spatial groove parts 115 of the lower substrate 100, each of the solar cells 200 may be inserted perpendicularly to or at a fixed angle to the lower substrate 100.

Hereinafter, the solar cells 200 are fixed to the insertion groove parts 201 of the lower substrate 100, respectively using an adhesive, photo-curable resin or thermosetting resin S140, and electrodes of the solar cells 200 are connected to one another S150. At this time, according to the other exemplary embodiment of the present invention, thanks to improvement of the structure of the conventional art in which solar cells located in transparent substrates are impregnated with sealing members, respectively, such as photo-curable resins or thermosetting resins and so on, an adhesive, photo-curable resin or thermosetting resin may be used only when the lower substrate 100, the solar cells 200, and the upper substrate 300 are combined with one another, and the solar cells 200 may be connected to one another via electrodes.

Moreover, when this adhesive, photo-curable resin, or thermosetting resin is used, follow-up heat treatment or ultraviolet (UV) treatment may be performed in order to reinforce the combination.

Then, the upper substrate 300 is disposed at and combined with an upper portion of the lower substrate 100 into which the solar cells are inserted, so the solar power generation module is completed S160.

Like this, the present invention has improved the structure of the conventional art in which the solar cells are impregnated with the sealing members, respectively, such as photo-curable resins or thermosetting resins, and so on, and accordingly, because the void spaces (the piercing parts or the spatial groove parts) are formed in the transparent substrate, the solar power generation module can reduce weight sharply.

Furthermore, the solar power generation module according to the present invention can minimize discoloration resulting from outdoor use for long time because curable resin is used in the minimum quantity, and can cause the penetration of sunlight to be realized naturally, thereby solving the problem which shows that a phase is distorted visually.

As previously described, in the detailed description of the invention, having described the detailed exemplary embodiments of the invention. However, it should be apparent that various modifications can be made without deviating from the scope of the invention. Therefore, it is to be understood that the technical ideas of the present invention should not be construed as being limited to the aforesaid exemplary embodiments, but should be established by the appended claims and their equivalents.

What is claimed is:

1. A solar power generation module, comprising:
a lower substrate; and
an upper substrate configured to be disposed on the lower substrate,
the lower substrate comprising:
piercing parts, each of the piercing parts being formed to pass through the lower substrate;
insertion groove parts, each of the insertion groove parts being formed between neighboring two piercing parts and having a groove shape;
solar cells, each of the solar cells being disposed in said each of the insertion groove parts of the lower substrate, and
the upper substrate being disposed at an upper part of the lower substrate on which the solar cells are disposed.

2. The solar power generation module of claim 1, wherein said each of the piercing parts is formed in a line type in the lower substrate, and said each of the solar cells is formed in a line type.

3. The solar power generation module of claim 1, wherein the lower substrate and the upper substrate are composed of a transparent material of a glass, acrylic, polycarbonate (PC), polyethylene (PE) or polymethyl methacrylate (PMMA) material.

4. The solar power generation module of claim 1, wherein said each of the solar cells is disposed perpendicularly to or at a fixed angle to said each of the insertion groove parts.

5. The solar power generation module of claim 1, wherein said each of the solar cells is 5 mm to 100 mm in width.

6. The solar power generation module of claim 1, wherein the solar cells consist of crystalline silicon solar cells, copper indium gallium selenide (CIGS) thin-film solar cells, cadmium telluride (CdTe) thin-film solar cells, or amorphous silicon solar cells.

7. The solar power generation module of claim 1, wherein the lower substrate, the solar cells, and the upper substrate are combined with one another using an adhesive, photo-curable resin, or thermosetting resin.

8. The solar power generation module of claim 1, wherein the upper substrate comprises groove parts having a shape corresponding to the piercing parts.

9. A method of manufacturing a solar power generation module, comprising:
- a first step of forming a lower substrate, the lower substrate comprising:
  - piercing parts, each of the piercing parts passing through the lower substrate, and
  - insertion groove parts, each of the insertion groove parts being disposed between neighboring two piercing parts and having a groove shape;
- a second step of cutting solar cells;
- a third step of inserting each of the solar cells into each of the insertion groove parts of the lower substrate;
- a fourth step of fixing the solar cells to the insertion groove parts of the lower substrate, respectively using an adhesive, photo-curable resin, or thermosetting resin;
- a fifth step of connecting electrodes of the solar cells to one another; and
- a sixth step of disposing an upper substrate at an upper portion of the lower substrate on which the solar cells are disposed, and combining the lower substrate, the solar cells, and the upper substrate with one another.

10. The method of claim 9, wherein each of the piercing parts has a line type, and each of the solar cells has a line type.

11. The method of claim 9, wherein the first step further comprises forming the lower substrate with a transparent material of a glass, acrylic, polycarbonate (PC), polyethylene (PE), or polymethyl methacrylate (PMMA) material, and the sixth step further comprises forming the upper substrate with a transparent material of a glass, acrylic, polycarbonate (PC), polyethylene (PE), or polymethyl methacrylate (PMMA) material.

12. The method of claim 9, wherein, in the third step, each of the solar cells is inserted perpendicularly to or at a fixed angle to said each of the insertion groove parts.

* * * * *